United States Patent [19]
Ephrath

[11] 4,283,249
[45] Aug. 11, 1981

[54] REACTIVE ION ETCHING

[75] Inventor: Linda M. Ephrath, Danbury, Conn.

[73] Assignee: International Business Machines Corporation, Armonk, N.Y.

[21] Appl. No.: 67,261

[22] Filed: Aug. 17, 1979

Related U.S. Application Data

[63] Continuation-in-part of Ser. No. 35,176, May 2, 1979, abandoned, which is a continuation of Ser. No. 840,085, Oct. 6, 1977, abandoned.

[51] Int. Cl.³ .................... H01L 21/306; B44C 1/22; C23F 1/00
[52] U.S. Cl. .................... 156/643; 156/646; 156/345; 204/192 E
[58] Field of Search ............ 156/643, 646, 657, 659, 156/662, 345; 204/164, 192 EC, 192 E, 298; 427/38; 250/531

[56] References Cited

U.S. PATENT DOCUMENTS

| 3,654,108 | 4/1972 | Smith | 204/164 |
| 3,940,506 | 2/1976 | Heinecke | 427/38 |
| 3,971,684 | 7/1976 | Muto | 252/79.1 X |
| 4,028,155 | 6/1977 | Jacob | 156/643 |

Primary Examiner—William A. Powell
Attorney, Agent, or Firm—Pollock, Vande Sande & Priddy

[57] ABSTRACT

A silicon oxide, nitride, and/or oxynitride surface on a substrate is selectively etched at a rate greater than that of the substrate by a reactive ion etching employing a gaseous mixture containing a fluorocarbon and a second gas capable of supplying hydrogen.

35 Claims, 3 Drawing Figures

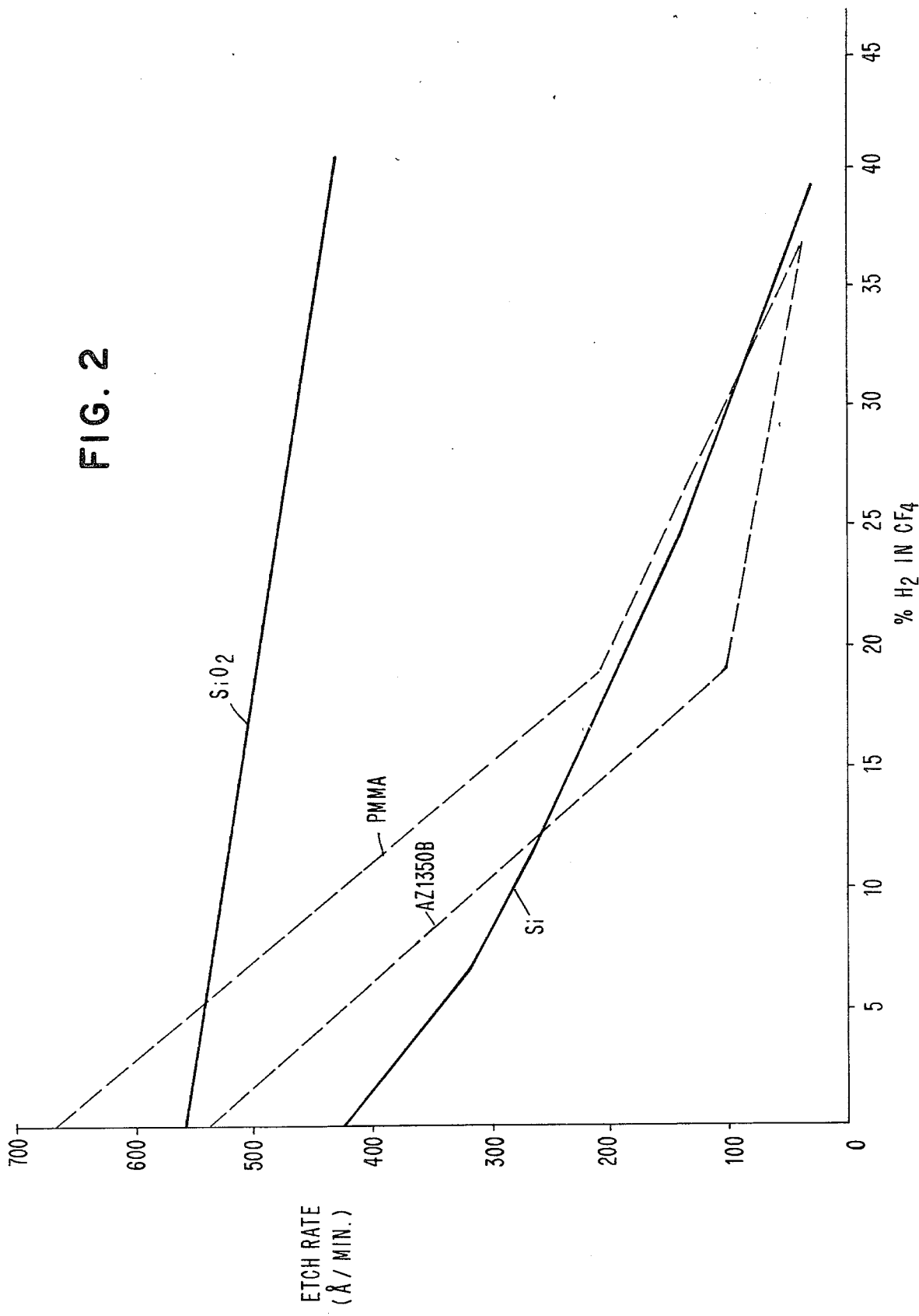

REACTIVE ION ETCHING

CROSS-REFERENCE TO RELATED APPLICATIONS

The present application is a continuation-in-part of U.S. Patent Application Ser. No. 035,176, filed May 2, 1979 and entitled "Reactive Ion Etching", now abandoned which in turn is a continuation of U.S. Patent Application Ser. No. 840,085, filed Oct. 6, 1977 and entitled "Reactive Ion Etching", and now abandoned.

DESCRIPTION

1. Technical Field

The present invention is concerned with the reactive ion etching of an article such as a wafer which includes a substrate and a surface thereon of a silicon oxide (e.g., SiO and/or $SiO_2$) and/or silicon nitride and/or silicon oxynitride whereby the silicon oxide and/or silicon nitride and/or silicon oxynitride is selectively etched at a rate greater than that of the substrate and/or at a rate greater than a resist material when used. The present invention is concerned with those ion etching processes whereby the article is positioned on a cathode which is at a relatively large negative DC bias relative to the gaseous mixture or plasma used for the etching.

2. Background Art

In the manufacture of semiconductor chips, the steps of etching different layers which constitute the finished chip are among the most critical and crucial steps. One method widely employed for etching is to overlay the surface to be etched with a suitable mask and then immerse the surface and mask in a chemical solution which attacks the surface to be etched while leaving the mask intact. These wet chemical etching processes suffer from the difficulty of achieving well-defined edges on the etched surfaces. This is due to the chemicals undercutting the mask such as by seeping under the mask and thereby continuing to attack the surface to be etched even under portions of the masked area.

A technique termed "plasma etching" has been suggested for the manufacture of semiconductor chips. This procedure generally involves filling a container such as a bell jar with a gas whose constituent ions are chemically reactive such as $CF_4$. The surface which is to be etched is covered by a mask and introduced into the container along with the reactive gas. The reactive gas is usually disassociated forming positive and negative ions by coupling radio frequency power to the plasma by a capacitive or inductive coupling. It is believed that the disassociated ions then chemically interreact with the surface to be etched. In such a process, the substrates are positioned either on a ground plane or at the same potential as the plasma gases. Plasma etching like chemical etching processes suffers from the tendency to undercut the masked areas.

Another process for etching semiconductor chips or thin film circuits is known as "sputter etching". Generally in sputter etching, a container such as a bell jar is filled with an inert gas such as argon. In the container are positioned an anode and cathode. The cathode is negatively biased relative to the anode, for instnace, by means of an applied radio frequency signal. The surface to be etched is covered by the suitable mask and is then placed on the cathode. When a radio frequency potential is applied to the cathode, the inert gas in the region between the cathode and the anode is ionized and the positive ions are attracted toward the cathode. The ions which strike the surface to be etched serve to knock atoms off the surface thereby gradually etching through the material. Sputter etching produces better processes but is relatively slow and very time consuming.

To overcome the slowness of such sputter etching processes, it has been suggested, for instance, in U.S. Pat. No. 3,971,684 to Muto and U.S. Pat. No. 3,984,301 to Matsuzaki et al to employ as the etching gas in a sputter etching process a chemically reactive gas such as $CF_4$. By applying an electric field, the reactive gas disassociates and the chemically reactive gas ions are attracted to the cathode. It is believed that the surface is etched both by chemical interreaction with the active ions and by the momentum transfer of the ions impinging on the surface. This is distinguished from plasma etching wherein only the chemical interreaction occurs during the etching process. Moreover, in view of the electric field attracting the ions to the cathode, the ions impinge on the surface to be etched predominantly in a direction perpendicular to that surface. Accordingly, the process which will be referred to herein as a reactive ion etching provides well-defined vertically etched sidewalls.

A problem associated with the above reactive ion etching processes is that the reactive gases employed attack various masking materials such as various electron beam resist and photoresist masks and such underlying substrates as silicon and various metals which form volatile fluorides including titanium, tantalum, molybdenum, and tungsten. In fact, certain attempts by personnel of the Fishkill facility of International Business Machines Corporation, the assignee of the present application, to improve the selective etching of silicon oxides and/or silicon nitrides with respect to the underlying substrate and resist masks by employing certain mixtures of $H_2$ and $CF_4$ at most resulted in only limited success. In particular, the addition of, for instance, about 10% $H_2$ as measured by the total pressure in a diode system of 40 microns total pressure, 100 watts power at 13.56 mhz. resulted in an etch rate of 20 A°/min. for Si; 350 A°/min. for $SiO_2$; 450 °A/min. for $Si_3N_4$ and 100A°/min. for AZ resist as reported in IBM invention disclosure FI8-760882. However, the draft report attached to said disclosure to R. Horwath dated Aug. 20, 1976 and entitled "RIE plasma diagnostics effort. Status report" on page 6 states:

"This has been a success story, rather partly. Hydrogen indeed showed the mechanistic routes in a simplistic model, but suffers from the disadvantage that is far from quantification. I fear that this will be a problem extremely machine dependent and any worker in this area planning to expend time should seriously work on the pumping problems associated with this gas."

In a prior draft report memo to R. Horwath entitled "Gas Additives for R.I.E. Processes. CF Hydrogen Results" also discussed were the real and practical problems being experienced. In particular, it was stated on page 2 of said draft report:

"At the present time we are experiencing considerable difficulties in maintaining flow and pressure to prefixed levels when two gases are used. This problem of monitoring and maintaining flows seems to be not a trivial one but one that is related to the pumping speeds in the main vacuum lines and is a strong function of the mobilities of the constituent gases in the mixture. The flows and pressures of the mixture are not simple additive functions of the individual gases. The only method of maintaining the flow rate constant seems to be one of using throttling control, not very convenient for regular operations. We fear that this situation should be one of the fundamental problems in specifying processes using two gases for etching work in R.I.E."

Further, on page 10 of said draft report it is stated: "As noted before, in the cases of mixed gas systems, we fear that reactor control is a critical problem."
Further, the problems experienced by the above-mentioned work were briefly discussed in a memo to D. Bunnell from N. S. Viswanathan dated May 17, 1978 and entitled "CF$_4$/H$_2$ experiments, Dept 933 efforts in the past." The conclusions stated are as follows:

"Typically, as far as I could make out of our data, we seem to have had the best results when the hydrogen: CF$_4$ ratio was in the 20–25% range. We had not noticed any polymer deposition in these cases. Obviously we were in the range much below the polymerisation points and we could not put too much hydrogen in the system because of system problems."

Further indication of the problems which persisted in achieving a workable reactive ion etching system using hydrogen can be found in a July 1976 Progress Report which states:

"The gas addition problem referred to in June progress report is unresolved. Our request for flow controllers has not recieved (sic) the managements release and we fear that our progress is seriously hampered by this. We wish to note here that none of the vacuum technology people in IBM have offered any concrete suggestion to solve this problem though all of them agree that this exists."

DISCLOSURE OF INVENTION

The present invention provides a reactive ion etching process of improved selective etching of silicon oxides and/or silicon nitride and/or silicon oxynitride with respect to the underlying substrate and photoresist and electron beam resist masks. The present invention also provides a process whereby the selective etching of the silicon oxides and/or silicon nitride and/or silicon oxynitride relative to the substrate and resist material can be accurately controlled.

It has also been found that according to the present invention, in view of the greatly improved relative etching rate of the silicon oxide and/or silicon nitride and/or silicon oxynitride as compared to that of the underlying substrate, a natural etch stop at the underlying substrate or thin diffused regions is achieved.

The present invention is directed to a method for reactive ion etching an article which includes a substrate and a silicon oxide and/or silicon nitride and/or silicon oxynitride surface on the substrate. The process includes positioning the article to be etched on a cathode, enclosing the cathode and the article to be etched on a cathode, enclosing the cathode and the article to be etched in a container. An etchant gas is introduced into the container.

The etchant gas is a mixture of a gaseous fluorocarbon capable of supplying CF$_3$ ions and a second gas capable of supplying hydrogen and being hydrogen, ammonia and/or a gaseous saturated aliphatic hydrocarbon. The fluorocarbon is present in the gas mixture in an amount sufficient to provide etching of the surface. The second gas is present in an amount sufficient to provide selective etching of the silicon oxide and/or silicon nitride at a rate greater than that of the substrate and/or resist when such is employed without causing formation of polymer species in said substrate. The relative amounts of the gases are based on molecular flow rate as measurable volume per unit time and are regulated by individual molecular flow rates prior to being mixed together.

An AC potential is applied to the cathode to thereby disassociate the reactive gases and to accelerate chemically reactive etchant gas ions toward the cathode.

BRIEF DESCRIPTION OF DRAWINGS

FIG. 2 illustrates etch rates for the stated conditions of the indicated surfaces at varying percents of H$_2$.

BEST AND VARIOUS MODES FOR CARRYING OUT INVENTION

Figure 1:
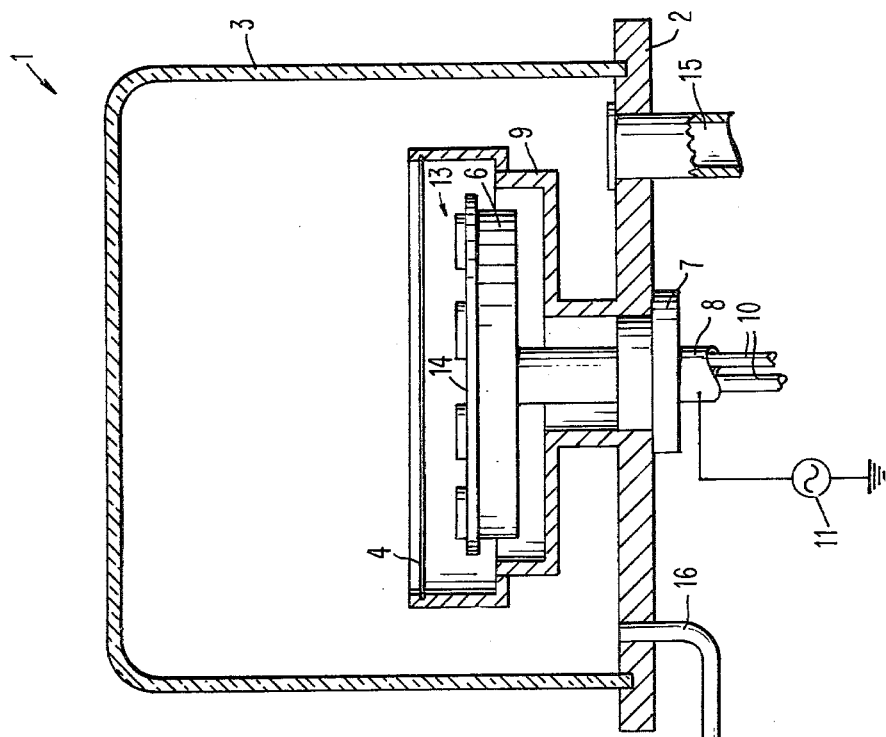
FIG. 1 is a schematic sectional view of apparatus which can be used to carry out the process of the present invention.

FIG. 1 depicts diagrammatically an apparatus suitable for carrying out the process of the present invention. In FIG. 1, there is illustrated a vacuum envelope 1 which includes a base plate 2 and a bell jar 3 such as a glass or metal bell jar which is hermetically sealed to the base plate 2. The volume of one vacuum envelope employed in the present invention was about 15 liters. Within the vacuum envelope 1 is an anode plate 4 and a cathode plate 14. The cathode plate 14 is electrically and mechanically connected to cathode 6. The anode plate 4 is positioned opposite the cathode plate 14. In some systems, the entire envelope as the anode.

The cathode is preferably a radio frequency electrode which includes a planar radio frequency electrode 6 having a stay, an insulating spacer 7 interposed between the electrode stay 8 and the base plate 2 to hold the electrode 6 substantially parallel to the base plate 2. It also includes a shield 9 for shielding the electrode 6. Moreover, the cathode 6 which usually is copper can be provided with a fluid conduit 10 for cooling the plate 14 when desired. Cooling may be desirable to prevent the resist material from degrading during the process. In addition, an AC and preferably a radio frequency power source 11 is connected between the electrode stay and ground.

The anode plate 4 is electrically and mechanically connected to shield 9 and is grounded. The anode plate 4 is preferably positioned about one inch away from the cathode and is perforated. Even though relatively lower power densities are normally used, there is still a tendency for the cathode plate material 14 when employing a metal such as aluminum, stainless steel, or copper, to somewhat sputter. When this occurs, the location of anode catches such sputtered metal and precludes it from diffusing back on the surface being etched.

Figure 3:
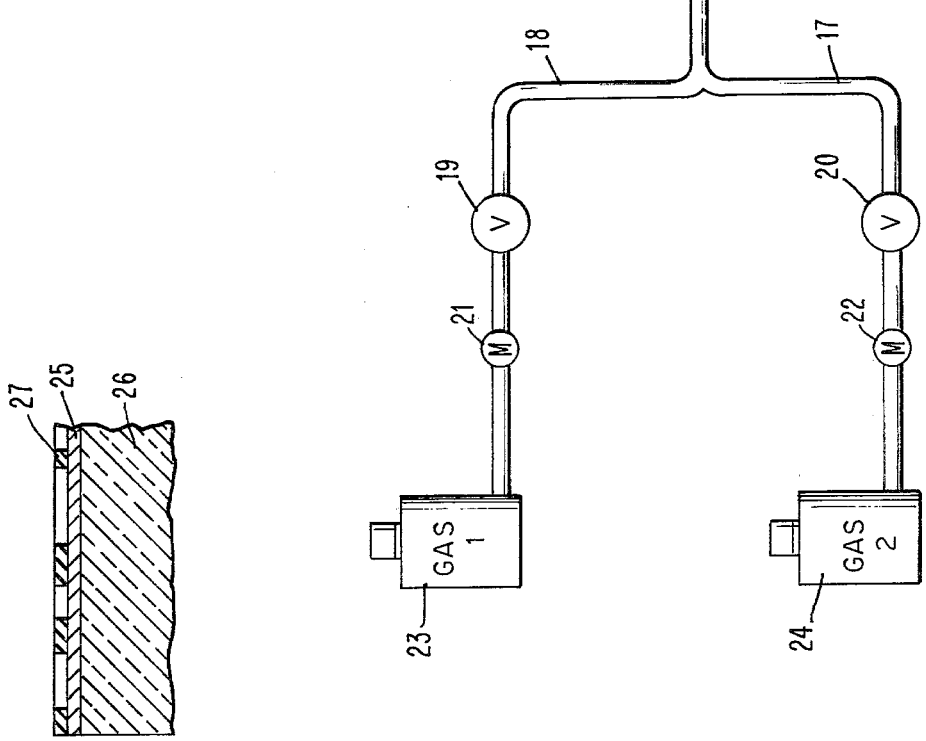
FIG. 3 illustrates a type of article subjected to the process of the present invention.

FIG. 1 illustrates etching a plurality of articles 13 placed on cathode plate or etching table 14. FIG. 3 illustrates in greater detail an article 13 having a substrate 26, surface 25, and mask 27.

The vacuum envelope includes an exhaust pipe 15 for evacuating the space enclosed in the vacuum envelope and is connected to a pumping means (not shown). The envelope can thereby be evacuated prior to subjecting the articles to the process of the present invention. The envelope also includes a conduit 16 which splits into conduits 17 and 18. Conduits 17 and 18 are provided with variable leak valves 19 and 20, respectively, and mass flow meters 21 and 22, respectively. Of course, each combination of leak valve and flow meter could be replaced by equipment which carries out the same functions such as a flow controller. Mass flow meters and mass flow controllers are available commercially such as from Matheson under the trade designation Series 8240 and 8260 Mass Flow Controllers and from Tylan Corporation under the trade designation Model FM-300 and FM-302 Mass flowmeter and Model FC-200 and FC-202 Mass flow controller. Mass flow-meters and controllers actually measure molecular and not mass flow by volume per unit time such as standard cubic centimeters per minute. Conduit 18 connects to gas storage vessell 23 for one of the gases while conduit 17 connects to gas storage vessel 24 for the other of the gases.

The articles subjected to the process of the present invention comprise a substrate and a surface thereon being a silicon oxide such as SiO and $SiO_2$ and/or silicon nitride and/or the silicon oxynitrides. The substrate can be any of the known suitable substrates employed in reaction ion etching including those materials which do not form volatile fluorides under the conditions of the process. Also, when the process is used in the preparation of patterned articles, a mask of, for instance, a photoresist or electron beam resist material is applied on top of the above-defined surfaces.

Moreover, the present invention, due to the selectivity achieved, makes it possible to use as the substrate materials in addition to those usually suggested, such as metals which form volatile fluorides including titanium, tantalum, molybdenum, and tungsten. Also, due to the selectivity achieved between the surface to be etched and resist materials, the present invention is particularly beneficial in those processes wherein a resist is present regardless of the type of substrate.

The etchant gas mixture employed according to the present invention includes a gaseous fluorocarbon capable of supplying $CF_3$ ions such as $CF_4$ or $CHF_3$ or $C_2F_6$. The preferred gaseous fluorocarbon is $CF_4$.

The second component of the gaseous mixture is a gas capable of supplying hydrogen to the plasma without introducing any other reactive species. Examples of some suitable gases include hydrogen, $NH_4$, and gaseous saturated aliphatic hydrocarbons such as methane, ethane, propane, and butane. The preferred gas is hydrogen.

The hydrogen must be supplied as an independent component separate from the fluorocarbon, even when the fluorocarbon also includes hydrogen. It has been noted that the use of fluorinated hydrocarbons such as $CHF_3$ without additional hydrogen being added as a separate constituent is not suitable for the purposes of the present invention since under the conditions of the present invention, the necessary etch rates were not achieved.

The gaseous fluorocarbon is present in the gaseous mixture in amounts sufficient to etch the surface and usually is present in amounts of about 30-90% and preferably about 30 to 75% of the total mass flow rate of the gases.

The gas providing the hydrogen is present in an amount sufficient to provide selective etching of the silicon oxide and/or silicon nitride and/or silicon oxynitride at a rate greater than the substrate and/or resist, if present. Generally, the molecular flow rate of the second gas is sufficient to provide $H_2$ in an amount from about 10 to about 70% and preferably about 25 to about 70% based upon the total molecular flow rate of the gases. Therefore, when the second gas is other than hydrogen, the flow of such will have to be mathematically calculated based upon the relative mass of $H_2$ in the molecule of the second gas to determine the flow rate to be used.

It is theorized herein that in the reaction ion etching, the reactive species are primarily positive $CF_3$ ions and halogen radicals such as fluorine. The addition of the hydrogen to a fluorocarbon plasma results in selective etching of silicon oxide and/or silicon nitride and/or silicon oxynitrides by scavaging, for example, the fluorine radicals by formation of HF. Accordingly, the fluorocarbon ion such as $CF_3$, which etches silicon oxides and silicon nitride but not silicon or other materials of the substrate, remains as the predominant etching species. Accordingly, the high etch rate ratios are obtained.

Use of about a 40% $H_2$ in $CF_4$ at a pressure of about 35 millitorr and a flow rate of about 30 cc/min. resulted in an etch rate ratio of silicon dioxide to silicon of about 35 to 1. The relative etch rate of the silicon dioxide to such resist materials as polymethyl methacrylate and Shipley AZ 1350 B was about 10 to 1. The absolute etch rate of the silicon dioxide was about 440 Å/minutes. In addition, under the same conditions, the etch rate ratio of $Si_3N_4$ to silicon and certain photoresists was 100 and 20, respectively, to 1.

The use of the gases in the reactive ion etching according to the present invention is quite different from the use of hydrogen in admixture with a gaseous fluorocarbon in plasma etching as suggested in U.S. Pat. No. 3,940,506 to Heinecke. For instance, in plasma etching, amounts of hydrogen about 40% by partial pressures cannot be employed since polymerization occurred (see column 2, lines 48-52). Moreover, the maximum ratio of etch rate achievable by such process of silicon dioxide to silicon was suggested as being 5:1. On the other hand, according to the present invention, significantly higher etch rate ratios are achievable. As discussed hereinabove, plasma etching is quite different from the reactive ion etching of the present invention since in plasma etching the ions are not accelerated to the substrate as such is at a ground or plasma potential. On the other hand, the acceleration experienced in reactive ion etching significantly enhances chemical interreaction.

It is preferred that the quantities of gases are regulated by relative molecular flow rates of the individual gases prior to being mixed together as determined by mass flow meters and/or mass flow controllers. This provides for the needed accuracy in regulating the flow rate in order to provide a uniform and reproducible process and to assure against polymerization which can occur when employing the high amounts of hydrogen according to the present invention. Other means of measuring the relative amounts of gases such as by partial pressures do not provide the accuracy preferred by the process of the present invention since there will be slight errors in such measurements and in fluctuations in the feed lines. The gases are removed from the vacuum chamber by use of suitable pumping means. In certain testing procedures, a six-inch liquid nitrogen cooled oil diffusion pump backed by a rotary mechanical pump was employed.

The process of the present invention is generally carried out under vacuum at pressures between about 5 and about 200 millitorr and preferably at least about 20 to about 100 millitorr. Pressures higher than about 100 millitorr generally result in polymerization at the higher hydrogen concentrations. Pressures of about 100 millitorr or less are preferred since such provide higher etch rate ratios.

A convenient power density for operating the radio frequency power source is between about 0.05 and 1 and preferably 0.1 to 0.5 watts per cm$^2$ of the cathode.

The total flow rate of the gases is generally at least about 10 cc/min. The maximum flow rate is primarily determined by the capacity of the pumping system. The preferred minimum flow rate is about 20 cc/min. The maximum preferred flow rate is about 1000 cc/min. The most preferred flow rate is about 20 to about 50 cc/min.

The residence time of the gases is preferably 2 seconds or less. The residence time can be calculated by using the following formula:

$$\text{Flow Rate [Torr Liters/second]} = \frac{\text{Volume(Liters)} \times \text{Pressure(Torr)}}{\text{Residence Time (seconds)}}$$

1 cc/min. = .76 Torr Liters/min.

Accordingly, for the disclosed preferred minimum flow rate of about 20 cc/min. at a volume of 15 liters as disclosed and a preferred pressure of about 35 millitorr, the residence time is about 2 seconds. When the flow rate is about 35 cc/min., the residence time is about 1.4 seconds. At 10 cc/min. for the above conditions, the residence time is about 7 seconds.

In order to obtain and accurately control the etch rate ratios and particularly those at relatively high levels (e.g.—20:1 and above) and also to prevent polymer formation over a less restrictive gas composition range, it is necessary to control the residence time and particularly to limit such to 2 seconds or less. Most preferably the residence time is about 1.4 seconds or less. At lower etch rate ratios, longer residence times such as up to about 7 seconds can be employed. Operating at low residence times permits high etch rates without polymer formation and without strict control on gas composition which is not always possible. On the other hand, the residence time is not a problem in a reactive ion etching system without a hydrogen containing gas and the results are generally similar over a wide range of residence times.

The actual etch rates of the substrate are usually between about 5 Å and 100 Å per minute and that of the silicon oxide and/or silicon nitride layer is about 250 Å to 1000 Å per minute. It is desirable to provide ratios of etch rates of the silicon oxide and silicon nitride to substrate of at least about 5:1, and preferably at least about 20:1.

The etch rate ratio of silicon oxides to resist materials is at least 10:1 and for the silicon nitride to resist is at least 20:1.

The preferred cathode plate material is a metal such as aluminum since the metal helps prevent the resist from reaching too high a temperature and then becoming fluid. The metal cathode acts as a heat sink and accordingly high speeds of etching can be employed. Moreover, if necessary, as mentioned hereinabove, the cathode can be cooled by external means.

What is claimed is:

1. A method for reactive ion etching an article which comprises a substrate and a surface thereon selected from the group of silicon oxides, silicon nitride, silicon oxynitride, and mixtures thereof which comprises:

positioning the article to be etched on a cathode;

enclosing in a container, the cathode and the surface to be etched;

introducing an etchant gas into said container wherein said gas is a mixture of gaseous fluorocarbon which is capable of supplying $CF_3$, and a second gas capable of supplying hydrogen selected from the group consisting of hydrogen, $NH_4$, gaseous saturated aliphatic hydrocarbons, and mixtures thereof, wherein the fluorocarbon is present in an amount sufficient to provide etching of said surface and the second gas is present in an amount sufficient to provide at least about 10% $H_2$ based on the total molecular flow rate of the gases as measurable by volume per unit time and being sufficient to selectively etch said surface at a greater rate than said substrate without causing polymerization on said substrate, wherein the gases are regulated by individual molecular flow rates prior to mixing together; and applying an AC potential to the cathode to disassociate the reactive gases and to accelerate chemically reactive etchant gas ions toward said cathode.

2. The method of claim 1 wherein said substrate is silicon.

3. The method of claim 1 wherein said substrate is a metal capable of forming a volatile fluoride.

4. The method of claim 1 wherein said substrate is a metal selected from the group of titanium, tantalum, molybdenum, and tungsten.

5. The method of claim 1 wherein said surface is silicon monoxide.

6. The method of claim 1 wherein said surface is silicon dioxide.

7. The method of claim 1 wherein said surface is silicon nitride.

8. The method of claim 1 wherein said surface is a silicon oxynitride.

9. The method of claim 1 wherein said gaseous fluorocarbon is selected from the group of $CF_4$, $CHF_3$, and $C_2F_6$.

10. The method of claim 1 wherein said etchant gas is a mixture of $CF_4$ and $H_2$.

11. The method of claim 1 wherein said gaseous fluorocarbon is $CF_4$.

12. The method of claim 1 wherein said second gas is hydrogen.

13. The method of claim 1 wherein said gaseous saturated aliphatic hydrocarbon is selected from the group of methane, ethane, propane, and butane.

14. The method of claim 1 wherein the second gas is present in an amount sufficient to provide about 10 to about 70% of $H_2$ based upon the total molecular flow rate of the gases and the remainder of the gases is the fluorocarbon.

15. The method of claim 1 wherein the second gas is present in an amount sufficient to provide about 25 to about 70% of $H_2$ based upon the total molecular flow rate of the gases and the remainder of the gases is the fluorocarbon.

16. The method of claim 1 wherein the etching is carried out at a pressure of between about 5 and about 200 millitorr.

17. The method of claim 16 wherein the etching is carried out at a pressure of about 100 millitorr or less.

18. The method of claim 17 wherein the etching is carried out at a pressure of at least about 20 millitorr.

19. The method of claim 1 wherein the cathode is biased by a radio frequency power source between about 0.05 and 1 watts/cm$^2$ of cathode.

20. The method of claim 1 wherein the cathode is biased by a radio frequency power source between about 0.1 and about 0.5 watts/cm$^2$ of cathode.

21. The method of claim 1 wherein the ratio of etch rates of the surface to the substrate is from about 5:1 to about 100:1.

22. The method of claim 1 wherein said article further includes a resist mask on top of said surface.

23. The method of claim 1 wherein said substrate is a material which does not form a volatile fluoride.

24. The method of claim 22 wherein the ratio of etch rates of the surface to the resist is at least about 10:1.

25. The method of claim 1 wherein the residence time of the etchant gas is about 2 seconds or less.

26. The method of claim 1 wherein the residence time of the etchant gas is about 1.4 seconds or less.

27. The method of claim 1 wherein said potential is a radio frequency potential.

28. The method of claim 1 wherein said cathode is aluminum.

29. The method of claim 1 wherein said residence time is about 7 seconds or less.

30. The method of claim 1 wherein said etchant gas is a mixture of $CF_4$ and $H_2$ containing about 40% of $H_2$.

31. The method of claim 1 wherein the ratio of etch rates of the surface to the substrate is at least about 20:1.

32. The method of claim 1 wherein the total flow rate of the gases is at least about 10 cc/min.

33. The method of claim 1 wherein the total flow rate of the gases is at least about 20 cc/min.

34. The method of claim 32 or 33 wherein the maximum total flow rate is about 1000 cc/min.

35. The method of claim 1 wherein the total flow rate of gases is about 20 to about 50 cc/min.

* * * * *

UNITED STATES PATENT AND TRADEMARK OFFICE
CERTIFICATE OF CORRECTION

PATENT NO. : 4,283,249
DATED : August 11, 1981
INVENTOR(S) : Linda M. Ephrath

It is certified that error appears in the above—identified patent and that said Letters Patent is hereby corrected as shown below:

Column 1:

On line 8, after the comma add --and--;

line 9, add a comma before the word "which";

line 62, change "instnace" to --instance--.

Column 2:

On line 8, change "al" to --al.--.

Column 3:

On line 16, indent starting with the word "Further" to start a new paragraph.

Column 4:

On line 14, change "requlated" to --regulated--;

line 42, after "envelope" add --acts--.

Column 5:

On line 20, change "flow-meters" to --flow meters--.

Signed and Sealed this

Fifth Day of July 1983

[SEAL]

Attest:

GERALD J. MOSSINGHOFF

Attesting Officer    Commissioner of Patents and Trademarks